US008164356B2

(12) United States Patent
Yeh

(10) Patent No.: US 8,164,356 B2
(45) Date of Patent: Apr. 24, 2012

(54) TESTING APPARATUS AND METHOD FOR TESTING A SEMICONDUCTOR DEVICES ARRAY

(75) Inventor: Chih Hui Yeh, Jhubei (TW)

(73) Assignee: Nanya Technology Corp., Taiwan (CN)

( * ) Notice: Subject to any disclaimer, the term of this patent is extended or adjusted under 35 U.S.C. 154(b) by 445 days.

(21) Appl. No.: 12/489,040

(22) Filed: Jun. 22, 2009

(65) Prior Publication Data
US 2010/0156452 A1 Jun. 24, 2010

(30) Foreign Application Priority Data

Dec. 19, 2008 (TW) .............................. 97149649 A

(51) Int. Cl.
*G01R 31/26* (2006.01)
*G01R 31/3187* (2006.01)
(52) U.S. Cl. ............ 324/762.01; 324/761.01; 324/750.3
(58) Field of Classification Search .. 324/762.01–762.1, 324/760.01–760.02, 757.01–757.05; 257/48
See application file for complete search history.

(56) References Cited

U.S. PATENT DOCUMENTS

| 5,231,345 A * | 7/1993 | Katakura et al. ............. 324/73.1 |
| 5,546,013 A * | 8/1996 | Ichioka et al. ............ 324/760.02 |
| 7,777,513 B2 * | 8/2010 | Kitabatake et al. ...... 324/762.01 |

* cited by examiner

*Primary Examiner* — Huy Q Phan
*Assistant Examiner* — Tung X Nguyen
(74) *Attorney, Agent, or Firm* — Ingrassia Fisher & Lorenz, P.C.

(57) ABSTRACT

A testing apparatus and a method for testing a semiconductor devices array, which includes a plurality of rows and a plurality of columns, are provided. The testing apparatus includes a first testing circuit and a second testing circuit. The first testing circuit connects and transmits a clock signal, an input command signal and a data signal to at least one of the rows of the semiconductor devices array. The second testing circuit connects and transmits a selecting signal to at least one of the columns of the semiconductor devices array. Between two devices in a row, a difference in arrival times of the clock signal, a difference in arrival times of the input command signal, and a difference in arrival times of the data signal are equal.

17 Claims, 5 Drawing Sheets

TESTING APPARATUS AND METHOD FOR TESTING A SEMICONDUCTOR DEVICES ARRAY

CROSS REFERENCE TO RELATED APPLICATIONS

This application claims the priority of co-pending Taiwanese Patent Application No. 097149649 entitled "TESTING DEVICE AND A METHOD FOR TESTING A SEMICONDUCTOR DEVICES ARRAY," filed on Dec. 19, 2008, which is incorporated herein by reference and assigned to the assignee herein.

FIELD OF THE INVENTION

The preferred embodiment is related to a testing apparatus for testing a semiconductor device array. More particularly, the testing apparatus has a testing circuit to transmit a clock signal, an input command signal, and a data signal to at least one row of the semiconductor device array, and has another testing circuit to transmit a selecting signal to at least one column of the semiconductor device array.

BACKGROUND OF THE INVENTION

FIG. 1a shows a conventional testing apparatus 100 for testing a semiconductor device array. The testing apparatus 100 is applied to test a device array that has a plurality of rows and columns of devices IC0-IC63. The testing apparatus 100 transmits a clock signal CLK, an input command signal TS, and a selecting signal SS in a vertical direction of the device array and transmits a data signal DS in a horizontal direction of the device array.

When the device array is under test, the testing apparatus 100 transmits the input command signal TS in the vertical direction and transmits the data signal DS in the horizontal direction. However, the input command signal TS or the data signal DS will get delayed at the devices IC0-IC63 because of the propagation delay time of the transmission lines between the devices IC0-IC63.

FIG. 1b illustrates the input command signal TS and the data signal DS at the IC0 and the IC7. The input command signal TS and the data signal DS respectively includes a setting signal Tsetup and a holding signal Thold. At the IC0, the setting signal Tsetup of the input command signal TS and the setting signal Tsetup of the data signal DS have the same delay relative to the clock signal CLK, which is one quarter clock signal CLK (shown as t1=0.25 tCLK). Both the setting signal Tsetup of the input command signal TS and the setting signal Tsetup of the data signal DS have a co-existing period with the half period of the clock signal CLK. The co-existing period must be long enough to make sure that writing the data signal DS to the device array is successful. If the co-existing period is not long enough, the input command signal TS or the data signal DS may write error signal to the device array, due to the external signal interference of the device array. However, in FIG. 1a, the arrival time of the input command signal TS and the clock signal CLK at each device IC0-IC63 are the same because the input command signal TS and the clock signal CLK are transmitted in parallel in the device array.

When the clock signal CLK (or the input command signal TS) is transmitted to the IC16 through the IC0 and the IC8, compared with the clock signal CLK (or the input command signal TS) at the IC0, the clock signal CLK (or the input command signal TS) at the IC16 is delayed twice, as shown as t2 of the clock signal CLK (or the input command signal TS) of the IC7 in FIG. 1b. However, compared with the data signal DS at the IC0, the data signal DS at the IC7, IC15 or IC23 respectively has been delayed seven times through the IC0~IC6, IC8~IC14, or IC16~IC22.

Now compare the IC0 with the IC7, the clock signal CLK has a co-existing period t1 relative to the setting time Tsetup of the data signal DS at the IC0. However, the co-existing period becomes t1' at the IC7 because the data signal DS and the clock signal CLK encounter different delays respectively. If the co-existing period t1' is too short, it is more likely to have test errors for the testing apparatus 100.

Therefore it is desirable to improve the drawback of the conventional testing apparatus for the semiconductor device array. The preferred embodiment has advantages in removing the testing error.

SUMMARY OF THE INVENTION

One aspect of the preferred embodiment is to provide a testing circuit for a semiconductor device array, and more particularly to a testing circuit transmits a clock signal, an input command signal, and a data signal to or along at least one of a plurality of the rows of the semiconductor device array, and another testing circuit transmits a selecting signal to or along at least one of a plurality of the columns of the semiconductor device array.

One embodiment is, to provide a testing apparatus for testing a semiconductor device array. More particularly, a first testing circuit transmits a clock signal, an input command signal and a data signal to at least one of the rows of the devices, and a second testing circuit transmits a selecting signal to at least one of the columns of the devices. While a row of the devices array further includes a first device and a second device to be tested, the first testing circuit transmits the clock signal and the input command signal in a manner that, between the first device and the second device, a difference in arrival times of the clock signal, a difference in arrival times of the input command signal, and a difference in arrival times of the data signal are equal.

Another embodiment is to provide a method for testing a semiconductor device array, where the semiconductor device array has a plurality of rows and columns. The method includes: (i) transmitting a clock signal, an input command signal, and a data signal to at least one of said rows of said semiconductor device array; and (ii) transmitting a selecting signal to at least one of said columns of said semiconductor devices array.

The foregoing and other features of the invention will be apparent from the following detailed description of embodiments of the invention.

BRIEF DESCRIPTION OF THE DRAWINGS

The preferred embodiment is illustrated by way of example and not intended to be limited by the figures of the accompanying drawing, in which like notations indicate similar elements.

FIG. 1b illustrates the signal sequences in the embodiment shown in the FIG. 1a;

FIG. 2b illustrates a the signal sequences in the embodiment shown in the FIG. 2a.

DETAILED DESCRIPTION OF THE INVENTION

As follows, the invention has been described with reference to specific embodiments. However, it will be appreciated that various modifications and changes can be made without departing from the scope of the preferred embodiment. The specification and figures are to be regarded in an illustrative manner, rather than a restrictive one, and all such modifications are intended to be included within the scope of preferred embodiment. Benefits, other advantages, and solutions to problems have been described above with regard to specific embodiments.

Figure 1A:
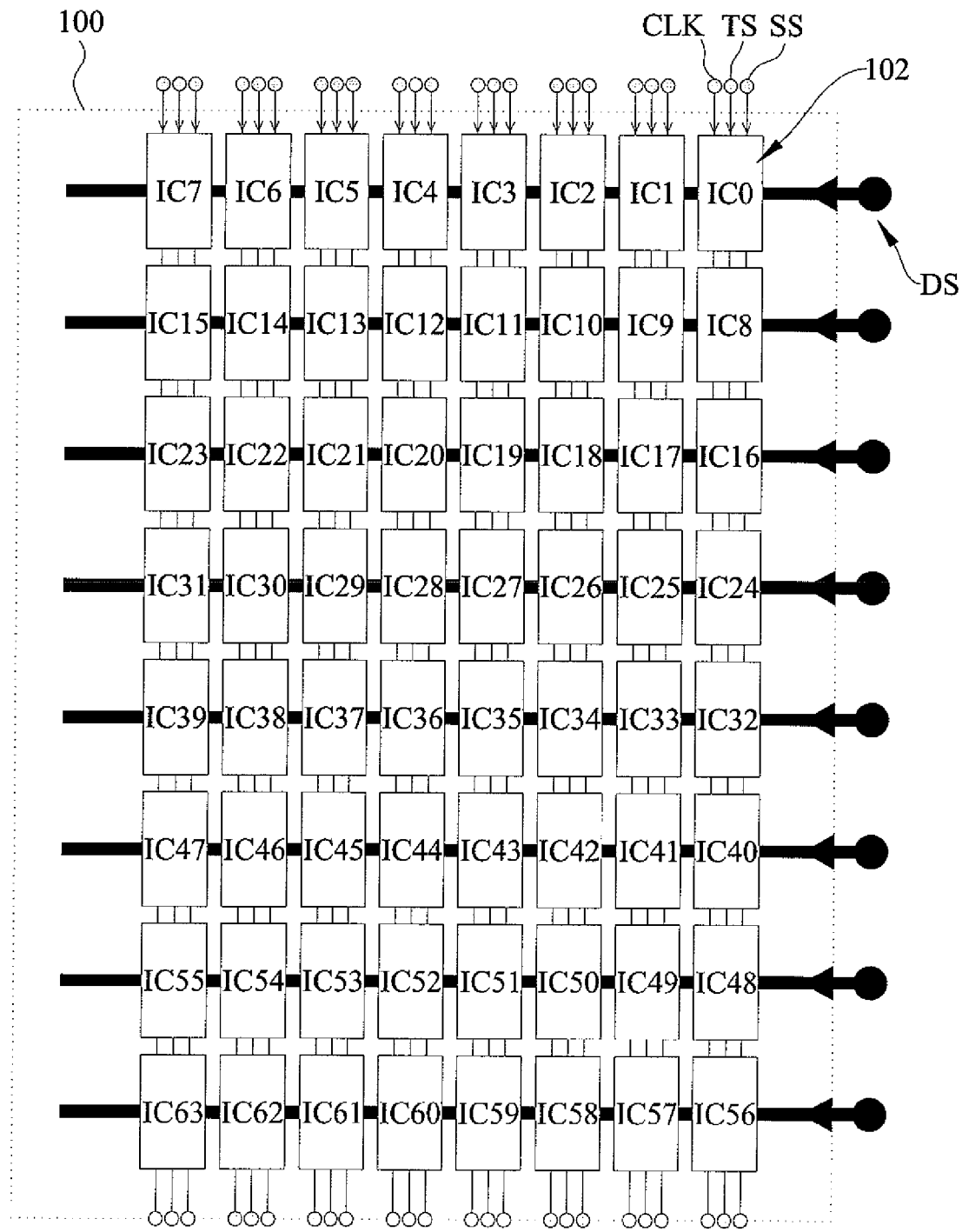
FIG. 1a illustrates a conventional testing apparatus for testing a semiconductor device.
Figure 1B:
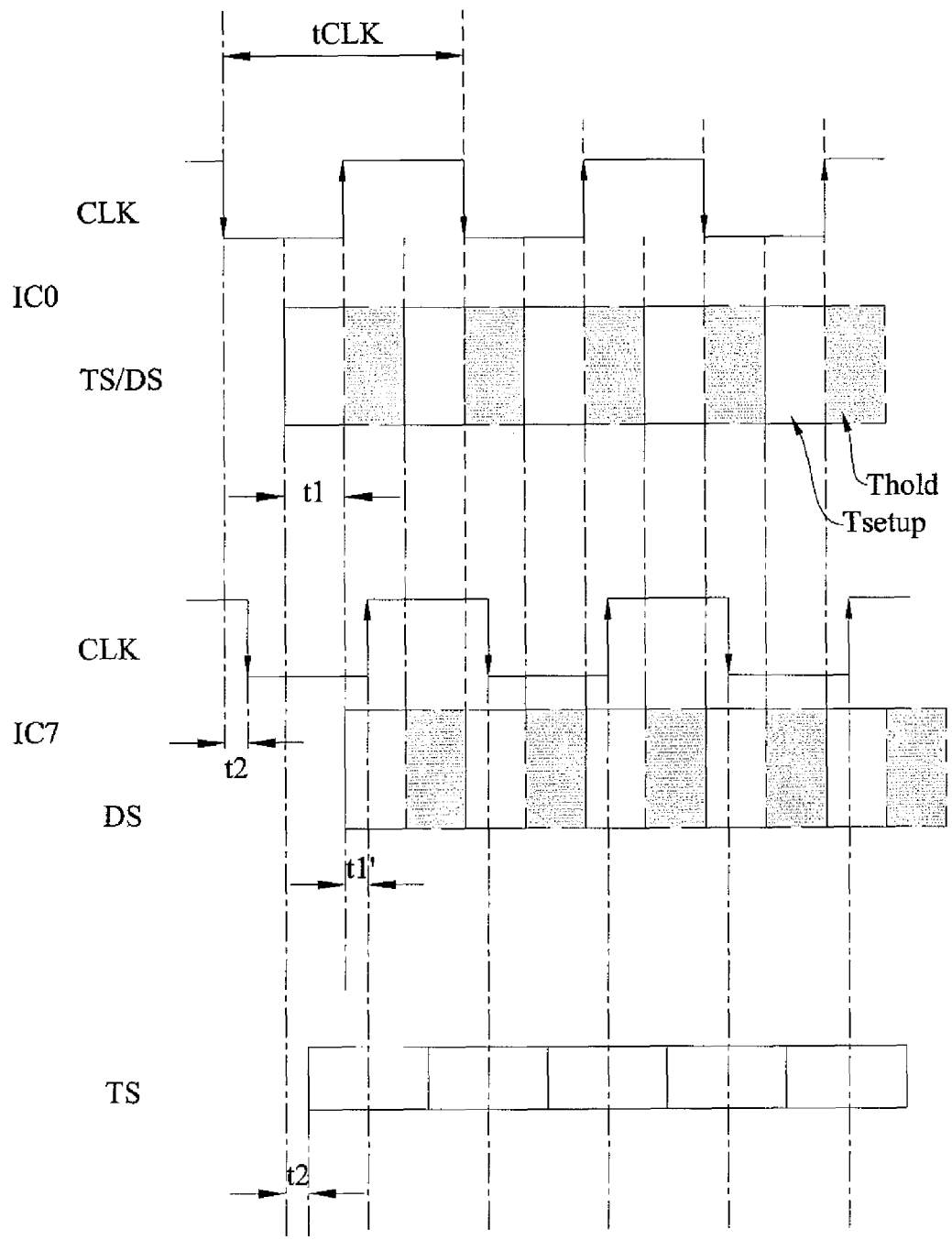
Figure 2A:
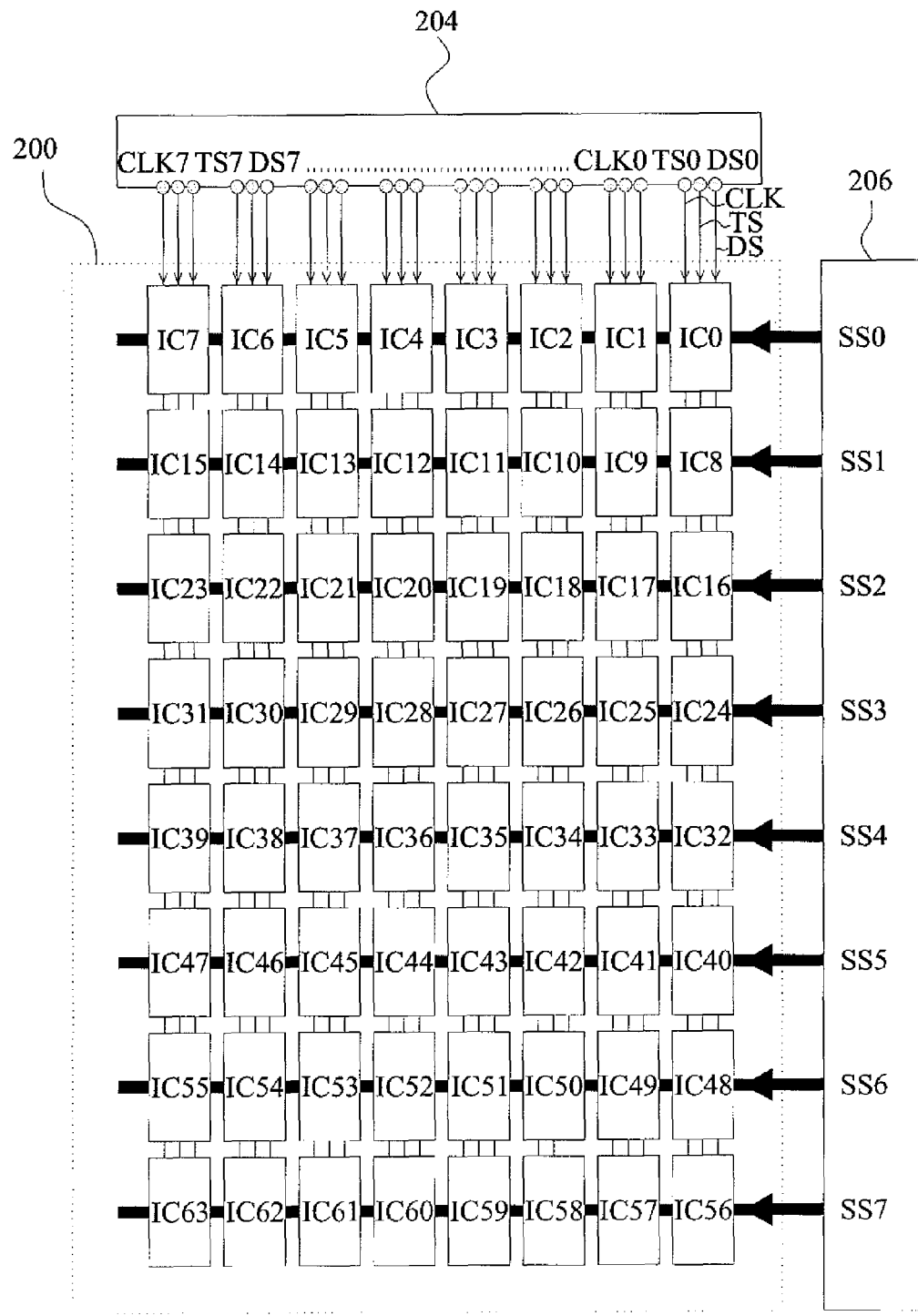
FIG. 2a illustrates a test device for testing the semiconductor device array according to one preferred embodiment.

FIG. 2a is a schematic diagram illustrating a testing apparatus for a semiconductor device array according to one embodiment of the preferred embodiment. In this embodiment, the testing apparatus 200 is configured to test a semiconductor device arrays having devices IC0-IC63, such as a Static Random Access Memory (SRAM) array, a Dynamic Random Access Memory (DRAM) array, a logic integrated circuit array, or a combination of aforementioned arrays.

In this embodiment, the devices IC0-IC63 are arranged in an 8×8 matrix array. There could be arrays of more or fewer devices in the actual application and the definition of rows and columns can be exchanged alternatively. The testing apparatus 200 includes a first testing circuit 204 and a second testing circuit 206. The first testing circuit 204 has several signal busses (e.g., 8 busses) to transmit clock signals CLK0-CLK7, input command signals TS0-TS7, and data signals DS0-DS7 to at least one of the rows of the devices IC0-IC63. For instance, one of the aforementioned rows may consist of the IC0, the IC8, and the IC16. The second testing circuit 206 also has several busses (e.g., 8 busses) to transmit selecting signals to at least one of the columns of the devices IC0-IC63. For instance, the aforementioned columns may consist of devices "IC0, IC1, . . . , IC7", "IC8, IC9, . . . , IC15", "IC16, IC17, . . . , IC23", "IC24, IC25, . . . , IC31", "IC32, IC33 . . . IC38, . . . , IC39", "IC40, IC41 . . . IC46, . . . , IC47", "IC48, IC49, . . . , IC55", or "IC56, IC57, . . . , IC63".

The clock signal CLK is provided to a timing reference for each device IC0-IC63. Especially, the clock signal CLK can be used to determine the operation of each device is synchronous or asynchronous. In general, the clock signal CLK is a square wave that can be divided into a leading edge and a trailing edge. For example, the clock signal CLK can be applied in a ring counter having a counter function, in a synchronous counter, in a flip-flop of a logic circuit having a memory function, a register, or a memory circuit.

Moreover, the input command signal TS includes an address signal and a control signal. The address signal may be provided for addressing any one row of devices IC0-IC63, so the external data signal DS can be written to one or more rows of devices IC0-IC63 according to the address assigned by the address signal. The control signal may include a row address strobe signal, a column address strobe signal, or a write-enabling control signal, to control an operation of one of devices IC0-IC63. For example, devices IC0-IC63 could be DRAMs, and the address of rows and columns of the devices IC0-IC63 can be searched according to the row address strobe and the column address strobe. The write-enabling control signal determines the external data signal DS written to or read from the data of the devices IC0-IC63.

In addition, the selecting signal SS is configured to select one row of devices IC0-IC63.

Figure 2B:
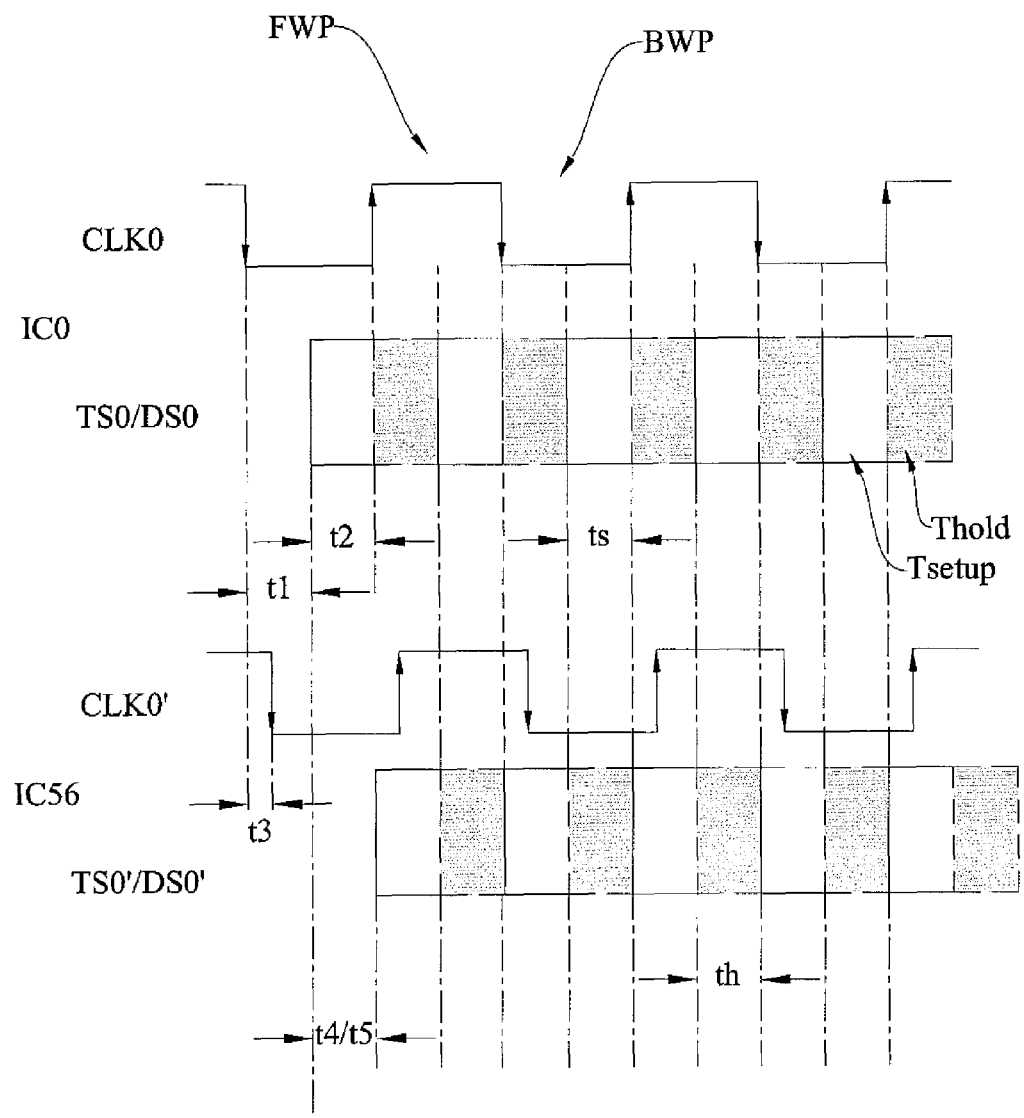

FIG. 2b illustrates the signal sequences in the embodiment shown in the FIG. 2a, and particularly shows the input command signal TS and the data signal DS at the IC0 and at the IC56. Here the input command signal TS is synchronized with the data signal DS, and each clock signal CLK is divided into a leading edge FWP and a trailing edge BWP. The data signal DS includes a setting signal Tsetup with a setting time ts and a holding signal Thold with a holding time th. Moreover, as shown in this embodiment, both a period of the input command signal TS and a period of the data signal DS are half a period of the clock signal CLK.

When the device IC0 is under test, IC0 receives the clock signal CLK0, the input command signal TS0, and the data signal DS from one bus of the first testing circuit 204. Note that the time shift T1 is between the clock signal CLK0 and the input command signal TS0 (or the data signal DS0), and the time shift t2 is between the setting signal Tsetup of the data signal the clock signal CLK0. In FIG. 2b, the time shift t2 is also equal to the setting time ts. However, if the clock signal CLK0 and the input command signal TS0 (or the data signal DS0) are going to reach IC56, they will be first received by IC0 and then be passed and delayed respectively by devices IC0, IC8, IC16, IC24, IC32, IC40, and IC46. Eventually, IC56 will receive the delayed clock signal CLK0', the delayed input command signal TS0', and the delayed data signal DS0'. Also note that the time shift t3 is between the clock signal CLK0 and the clock signal CLK0'; the time shift t4 is between input command signal TS0 and the input command signal TS0'; the time shift t5 is between the data signal DS0 and the data signal DS0'. However, the clock signal CLK0', the input command signal TS0', and the data signal DS0' have the same delay because they are delayed by the same row of the devices.

One row of devices IC0-IC63 includes a first device (such as IC0) and a second device (such as IC56). When devices IC0-IC63 is under test, the first testing circuit 204 transmits the clock signal CLK and the input command signal TS (such as the address signal or the control signal) in a manner that, between the first device IC0 and the second device IC56, a difference in arrival times of the clock signal CLK, a difference in arrival times of the input command signal TS, and a difference in arrival times of the data signal DS are equal. In addition, the data signal DS further includes a setting signal Tsetup and a holding signal Thold, and, between the leading edge FWP and the setting signal Tsetup, a difference in arrival times at the first device IC0 is equal to a difference in arrival times at the second device IC56.

Figure 3:
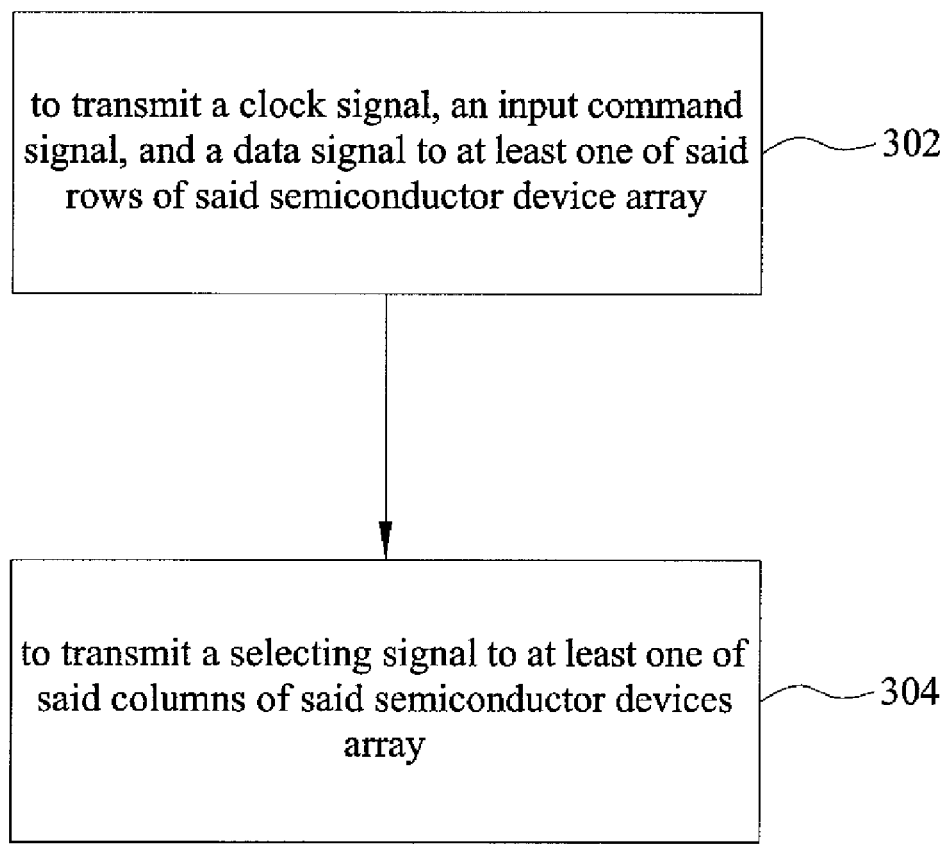
FIG. 3 illustrates a flow chart of the test device for testing apparatus array according to one preferred embodiment.

FIG. 3 is a flow chart 300 illustrating a testing apparatus for testing a semiconductor device array according to one embodiment of the preferred embodiment. The semiconductor device array has a plurality of rows and a plurality of columns. Step 302 is transmitting the clock signal, the input command signal, and the data signal to at least one of the rows of the semiconductor device array; Step 304 is transmitting the selecting signal to at least one of the columns of the semiconductor device array. In an embodiment, at least one of the rows of the semiconductor device array further includes the first device and the second device to be tested, and the testing method further makes, between the first device and the second device, a difference in arrival times of said clock signal, a difference in arrival times of said input command signal, and a difference in arrival times of said data signal equal. The clock signal is divided into a leading edge and a trailing edge. The data signal includes a setting signal and a holding signal, and the method further makes, between the leading edge and the setting signal, a difference in arrival times at the first device equal to a difference in arrival times at the second device.

While this invention has been described with reference to the illustrative embodiments, these descriptions should not be construed as a limit. Various modifications of the illustrative embodiment, as well as other embodiments of the invention, will be apparent upon reference to these descriptions. It is therefore contemplated that the appended claims will cover any such modifications or embodiments as falling within the true scope of the invention and its legal equivalents.

What is claimed is:

1. A testing apparatus for testing a semiconductor device array having a plurality of rows and columns of devices to be tested, said row comprising a first device and a second device, said testing apparatus comprising:
   a first testing circuit for connecting and transmitting a clock signal, an input command signal, and a data signal to at least one of said rows of devices; and
   a second testing circuit for connecting and transmitting a selecting signal to at least one of said columns of devices to select said column;
   wherein said first testing circuit transmits said clock signal, said input command signal, and said data signal to said row in a manner that, between said first device and said second device, a difference in arrival times of said clock signal, a difference in arrival times of said input command signal, and a difference in arrival times of said data signal are equal.

2. A testing apparatus according to claim 1, wherein said clock signal is divided into a leading edge and a trailing edge.

3. A testing apparatus according to claim 2, wherein said data signal comprises a setting signal and a holding signal, and, between said leading edge and said setting signal, a difference in arrival times at said first device is equal to a difference in arrival times at said second device.

4. A testing apparatus according to claim 2, wherein said input command signal further comprises an address signal to address said row.

5. A testing apparatus according to claim 2, wherein said input command signal further comprises a control signal to control an operation of a device of said semiconductor device array.

6. A testing apparatus according to claim 1, wherein a period of said input command signal is half a period of said clock signal.

7. A testing apparatus according to claim 1, wherein a period of said data signal is half a period of said clock signal.

8. A testing apparatus according to claim 1, wherein said semiconductor devices array is a Static Random Access Memory (SRAM) array, a Dynamic Random Access Memory (DRAM) array, a logic integrated circuit array, or a mixed integrated circuit array of said mentioned above arrays.

9. A testing apparatus for testing a plurality of devices to be tested, said plurality of devices comprising a first device and a second device, said testing apparatus comprising:
   a first testing circuit for connecting and transmitting a clock signal and a data signal to said plurality of devices, wherein said clock signal and said data signal are propagated across said plurality of devices; and
   a second testing circuit for connecting and transmitting a selecting signal to one of said plurality of devices to select said device;
   wherein said first testing circuit transmits said clock signal to said plurality of devices in a manner that, between said first device and said second device, a difference in arrival times of said clock signal and a difference in arrival times of said data signal are equal.

10. A testing apparatus according to claim 9, wherein said clock signal is divided into a leading edge and a trailing edge.

11. A testing apparatus according to claim 10, wherein said data signal comprises a setting signal and a holding signal, and, between said leading edge and said setting signal, a difference in arrival times at said first device is equal to a difference in arrival times at said second device.

12. A testing apparatus according to claim 9, wherein a period of said data signal is half a period of said clock signal.

13. A testing apparatus according to claim 9, wherein said first testing circuit further transmits an input command signal to said plurality of devices, and said input command signal is propagated across said plurality of devices.

14. A testing apparatus according to claim 13, said plurality of devices comprising a first device and a second device;
   wherein said first testing circuit transmits said clock signal to said plurality of devices in a manner that, between said first device and said second device, a difference in arrival times of said clock signal, a difference in arrival times of said input command signal, and a difference in arrival times of said data signal are equal.

15. A testing apparatus for testing a semiconductor device array having a plurality of rows and columns of devices to be tested, each row comprising a first device and a second device, said testing apparatus comprising:
   a first testing circuits having a plurality of first busses, each first bus connecting and transmitting a clock signal, an input command signals, and a data signal to one of said rows of devices; and
   a second testing circuit having a plurality of second busses, each second bus connecting and transmitting a selecting signal to one of said columns of devices to select said column;
   wherein each first bus transmits said clock signal, said input command signal, and said data signal to one of said rows in a manner that, between said first device and said second device, a difference in arrival times of said clock signal, a difference in arrival times of said input command signal, and a difference in arrival times of said data signal are equal.

16. A testing apparatus according to claim 15, wherein said clock signal is divided into a leading edge and a trailing edge.

17. A testing apparatus according to claim 16, wherein said data signal comprises a setting signal and a holding signal, and, between said leading edge and said setting signal, a difference in arrival times at said first device is equal to a difference in arrival times at said second device.

* * * * *